United States Patent
Chiu et al.

(10) Patent No.: US 7,469,788 B2
(45) Date of Patent: Dec. 30, 2008

(54) AIRTIGHT SEMICONDUCTOR TRANSFERRING CONTAINER

(76) Inventors: Ming-Lung Chiu, P.O. Box 108-00403, Taipei (TW) 106; Yu-Chian Yan, P.O. Box 108-00403, Taipei (TW) 106

( * ) Notice: Subject to any disclaimer, the term of this patent is extended or adjusted under 35 U.S.C. 154(b) by 518 days.

(21) Appl. No.: 11/161,754

(22) Filed: Aug. 16, 2005

(65) Prior Publication Data

US 2006/0127205 A1    Jun. 15, 2006

(51) Int. Cl.
*B65D 85/86* (2006.01)
(52) U.S. Cl. .................. 206/710; 206/719; 206/722; 206/724
(58) Field of Classification Search ............. 206/455, 206/710, 719, 722, 723, 724; 355/53, 72, 355/75; 414/217.1, 937, 939
See application file for complete search history.

(56) References Cited

U.S. PATENT DOCUMENTS

| | | | | |
|---|---|---|---|---|
| 4,804,086 A | * | 2/1989 | Grohrock | 206/710 |
| 5,024,329 A | * | 6/1991 | Grohrock | 206/710 |
| 5,611,452 A | * | 3/1997 | Bonora et al. | 220/378 |
| 6,042,651 A | * | 3/2000 | Roberson et al. | 118/715 |
| 6,216,873 B1 | * | 4/2001 | Fosnight et al. | 206/710 |
| 2004/0005209 A1 | * | 1/2004 | Su et al. | 414/217.1 |
| 2005/0200829 A1 | * | 9/2005 | Chiu | 355/75 |
| 2006/0244942 A1 | * | 11/2006 | Gregerson et al. | 355/72 |
| 2006/0260978 A1 | * | 11/2006 | Gregerson et al. | 206/710 |

* cited by examiner

*Primary Examiner*—David T Fidei
(74) *Attorney, Agent, or Firm*—Ming Chow; Sinorica, LLC

(57) ABSTRACT

An airtight semiconductor transferring container is disclosed to included a container base, an elastically deformable packing member covered on the top surface of the container base, and a top cover closed on the container base, the top cover having an outer cover body, and an elastically deformable inner lining shell fitted into the outer cover body, the elastically deformable inner lining shell having a downwardly protruding peripheral flange, which is pressed on the border area of the elastically deformable packing member to keep the inside space of the airtight semiconductor transferring container in an airtight status after closing of the top cover on the container base.

7 Claims, 12 Drawing Sheets

US 7,469,788 B2

AIRTIGHT SEMICONDUCTOR TRANSFERRING CONTAINER

This application claims the priority benefit of Taiwan patent application number 093139029 filed on Dec. 15, 2004.

BACKGROUND OF THE INVENTION

1. Field of the Invention

The present invention relates to a semiconductor container for carrying wafers/masks and more particularly, to an airtight semiconductor transferring container, which uses an elastically deformable inner lining shell and an elastically deformable packing member to keep the inside holding space in an airtight status.

2. Description of the Related Art

IC (Integrated Circuit) is one of the most important elements that construct the so-called "third wave revolution" or "information revolution". Computer, mobile phone, Internet, and LCD are important inventions of this digital era that greatly influence the living of human beings. Because IC chip has a wide application, it is used in a variety of electronic consumer products including computer and mobile phone. Following fast development of semiconductor technology, electronic products are designed to meet the requirements of modern electronic features such as light, thin, short, small, high speed, high frequency, high performance, and high precision. Heavy market demand for electronic products having modern electronic features promotes development of semiconductor technology towards this market trend. In consequence, investment in semiconductor industry keeps increasing in recent years. Every manufacturer is trying hard to create new technology in order to take the leading place in the market so as to enjoy huge commercial profit from the market. In order to survive from severe market competition, it is important to reduce the cost and improve the efficiency in this semiconductor field.

IC fabrication is an application of photolithography. This technique is to have an electronic circuit pattern on a mask reticle be projected onto a wafer by light. After developing and baking, a contracted circuit pattern is formed on the wafer. The water thus obtained is then processed through other posterior procedures such as wafer saw, die attach, wire bond, molding . . . and etc. Therefore, reducing line width should be achieved by improving photolithographic process. A relatively smaller line-width CD value means a relative bigger number of transistors in a unit area, and the IC will have a relative stronger function, lower power consumption and lower cost. For example, when improved the manufacturing process of a 128 MB DRAM from 0.25 µm to 0.13 µm, the productivity for 8 inches wafer will be increased by 4 times, or the number of dies will not be significantly reduced when improved the production to 256 MB DRAM. This is the. Moore's law that is the observation made in 1965 by Intel co-founder Gordon Moore that each new memory integrated circuit contained roughly twice as much capacity as its predecessor, and each chip was released within 18-24 months of the previous chip.

Due to Moore's law, the successability of technical improvement toward smaller line width CD value is determined subject to photolithographic techniques, and scanner is the key implement. Currently, 248 nm deep-UV is intensively used for 0.11 µm photolithography. However, due to wavelength's sake, it is not possible to have the downward going line be in the way like 90 nm~65 nm. Further, the use of 248 nm deep-UV for 0.11 µm lithography requires the so-called PSM (phase shift mask) reticle, which is made of molybdenum (MO) that is about 2~3 times over the price of chromium (Cr). In order to obtain a relatively smaller line width, the wavelength of the exposure machine should be relatively shorter. Therefore, 248 nm deep-ultraviolet light is intensively used to substitute for 365 nm ultraviolet. Recently, there are manufacturers studying the use of 193 nm deep-ultraviolet photoresist and light source of ultra short wave (Argon fluoride excimer laser to generate 193 nm deep-ultraviolet light) to improve lithographic process to the stage of 0.13 µm~65 nm.

However, current semiconductor manufacturers commonly use SMIF system provided by Hewlett-packard for storing and transporting wafers/masks, i.e., the so-called enclosed transferring container. SMIF system is designed to reduce particle flux in storage and transport of semiconductor products during a semiconductor manufacturing process. This objective is achievable by: keeping the air proximity to the wafer or mask from change relative to the wafer or mask during storage and transport so as to prevent passing of particles from the surroundings into the air proximity to the wafer or mask. SMIF system uses a small amount of particle-free air to provide a clean environment for the object where the movement and flowing direction of the air and pollutant are well controlled. This measure greatly reduces the cost for clean room.

Before using 193 nm deep-UV to run a lithographic process, as shown in FIG. 1, the photomask A and the pellicle B are stored in an enclosed storage container (semiconductor transferring container) D. When in use, the photomask A and the pellicle B are taken out of the enclosed storage container D and put in a mini-environment, and then radiated with 193 nm deep-UV. At this time, harmful crystals C are formed on the surface of the photomask A and the pellicle B. These crystals C lower the transmittance of the photomask A and the pellicle B, thereby resulting in distortion of the circuit pattern on mask reticle or low yielding rate. Sometimes, the whole lot of wafers becomes unusable. This problem is indeed serious. This problem is also seen in the old manufacturing process with 365 nm ultraviolet light. However, because the old manufacturing process employs a relatively longer wavelength that has a relatively lower energy to provide a relatively lower capacity, the transparency of crystals formed on wafers after radiation is still high enough, and the problem of crystal formation on wafers during running of the old manufacturing process is never so serious to obstruct the product. According to experimentation, the transmittance of crystals formed on the wafers after radiation with 365 nm ultraviolet light T=76.1%; the transmittance of crystals formed on the wafers after radiation with 248 nm deep-UV T=29.2%, which is approximately the limit; the transmittance of crystals formed on the wafers after radiation with 193 nm deep-UV T=13%, which is about the opaque status. If this problem is not settled, semiconductor manufacturing process will be limited to 0.11 µm, and the unit transistor capacity will not be doubled as within 18 months as expected subject to Moore's law.

According to Example I in FIG. 2, the photomask A and the pellicle B were kept in an enclosed plastic storage container D at 40° C. for 3 days, and then the photomask A and pellicle B were taken out of the enclosed plastic storage container D and put in a mini-environment and radiated with 193 nm deep-UV, and crystals C were found on the surface of the photomask A and the pellicle B. According to Example II in FIG. 2, the photomask A and the pellicle B were put in an enclosed plastic storage container D at 40° C. for 3 days, and then mask reticle A was taken out of the enclosed plastic storage container D and put in a mini-environment and radiated with 193 nm deep-UV, and crystals C were found on the surface of the photomask A. According to Example III in FIG. 2, the photomask A and the pellicle B were put in an enclosed stainless steel storage container D at 40° C. for 3 days, and then the photomask A and the pellicle B were taken out of the enclosed stainless steel storage container D and put in a mini-environment and radiated with 193 nm deep-UV, and no crystal formation was seen on the surface of the photomask A and the pellicle B. This study shows crystal formation has a great concern with the storage container D.

According to study, we wound the reasons of crystal formation as follows.

1. According to analysis, the chemical formula of the crystals formed on the photomask and the pellicle is $(NH_4)_2SO_4$, mainly composed of $(NH_4)^+$ and $(SO_4)^{2-}$. During synthesis, there are important catalysts: (a) light source of short wavelength and high energy, (b) organic or inorganic gas, (c) environment humility.

2. Either the use of Krypton fluoride excimer laser to generate 248 nm deep-ultraviolet light or Argon fluoride excimer laser to generate 193 nm deep-ultraviolet light, the narrow pulse light has a high energy that is continuously supplied during photolithography, which causes crystal formation upon its radiation on photomask. It shows that the shorter the wavelength is, the higher the energy and the lower the transmittance of crystal will be.

3. Poor airtight status of the storage container allows passing of wet air (water molecule) from the outside clean room into the inside of the storage container to provide element requisite for its chemical reaction, and therefore crystals are formed on the surface of the photomask and the pellicle after removal from the storage container and radiation with 193 nm deep-UV.

4. The material of the storage container itself releases harmful gas that penetrates into the inside of the pellicle, thereby causing formation of crystals on the photomask and the pellicle after removal from the storage container and radiation with 193 nm deep-UV.

5. Because the pellicle frame is made of aluminum alloy treated with a sulfuric acid anodizing process, a big amount of sulphate ion $(SO_4)^{2-}$ is left on the surface of the aluminum pellicle frame.

In order to prevent the aforesaid crystal formation problem, the most important measure is to enhance the airtight status of the storage container. As shown in FIGS. 3 and 4, comprises a container door (a), a packing strip (a1) covered with a layer of film material (a2) and fastened to the periphery of the container door (a). When the user closed a top cover (b) on the container door (a), a sharp edge (b1) of the top cover (b) is pressed on the layer of film material (a2) against the packing strip (a1) to seal the gap. Further, the storage container has a lifting mechanism for allowing the top cover (b) to be moved vertically between the close position and the open position. For easy opening of the top cover to meet SMIF specifications, the lifting mechanism cannot provide a relatively stronger locking force. Further, because the container door (a) is a square structure over 200 mm×200 mm and because the packing strip (a1) and the layer of film material (a2) are flexible and extended over the periphery of the container door (a), the surface of the layer of film material (a2) is not kept smooth. When closing the top cover (b) on the container door (a) to press the sharp edge (b1) of the top cover (b) on the layer of film material (a2) against the packing strip (a1) to the hard shell of the top cover (b), the layer of film material (a2) and the packing strip (a1) may receive different components of force from the top cover (b) at different locations (due to manufacturing tolerance in precision of the top cover). At this time, the small locking force of the lifting mechanism is insufficient to keep the whole area of the sharp edge (b1) of the top cover (b) engaged into the layer of film material (a2) against the packing strip (a1), and local tiny crevices (c) will be left in between the sharp edge (b1) of the top cover (b) and the layer of film material (a2), allowing outside air to pass through the local tiny crevices (c) into the inside of the storage container.

Further, the aforesaid enclosed storage container (semiconductor transferring container) generally has a valve structure through which an inertia gas can be filled into the inside space of the container. As illustrated in FIG. 6, the valve structure of the container (e) comprises a through hole (e1), a T-valve (f), which is mounted in the through hole (e1) and has an axial insertion hole (f1) and a radial outlet (f2), and a spring member (g) mounted inside the through hole (f1) around the T-valve (f) to hold the T-valve (f) in the close position. When inserting a nozzle tip (h) into the insertion hole (f1) to lift the T-valve (f) upwards from the bottom wall of the container (e), the radial outlet (f2) is opened, and an inertia gas can then be supplied through the nozzle tip (h) into the inside of the container (e). After removal of the nozzle tip (h) from the T-valve (f), the spring member (g) immediately pulls the T-valve (f) back to the close position. This design of valve structure is still not satisfactory in function because movement of the T-valve (f) in the through hole (e1) will cause the spring member (g) to rub against the peripheral wall of the through hole (e1), thereby producing particles.

In general, the aforesaid prior art enclosed transferring containers have numerous drawbacks as outlined hereinafter.

1. When closed the top cover on the container door, small crevices will be left between the top cover and the container door for allowing inside clean air (inertia gas) to pass to the outside and outside foul air to pass into the inside of the container to contaminate storage wafers/masks.

2. The plastic materials of the container will release inorganic gas, such as sulfide, thereby causing formation of crystals on the surface of storage wafers/masks.

3. When filling an inertia gas into the container through the valve structure, the spring member of the valve structure will be force to rub against the peripheral wall of the through hole, thereby producing particles to contaminate storage waters/masks.

4. The hard shell of the top cover of the container and the container door may deform slightly after a long use, lowering the airtight status of the container.

5. Because tiny crevices may be left between the top cover and the container door and outside air may pass through the tiny crevices into the inside of the container gradually, storage wafers/masks cannot be kept in the container for long, and the control person must arrange storage wafers/masks subject to the law of first in first out, complicating the management.

SUMMARY OF THE INVENTION

The present invention has been accomplished under the circumstances in view. It is therefore the main object of the present invention to provide an airtight semiconductor transferring container, which keeps the inside space in a wall airtight status, preventing contamination. It is another object of the present invention to provide an airtight semiconductor transferring container, which absorbs sulfide, preventing crystal formation on storage wafers/masks.

According to one aspect of the present invention, the airtight semiconductor transferring container comprises a container base, an elastically deformable packing member covered on the top surface of the container base, and a top cover closed on the container base, the top cover having an outer cover body and an elastically deformable inner lining shell fitted into the outer cover body, the elastically deformable inner lining shell having a downwardly protruding peripheral flange, which is pressed on the border area of the elastically deformable packing member to keep the inside space of the airtight semiconductor transferring container in an airtight status after closing of the top cover on the container base.

According to another aspect of the present invention, the container base has at least one hollow stud respectively mounted in a respective stud hole (air filling hole) thereof, and is fixedly mounted with a springy holding down sheet member to hold down the elastically deformable packing member on the top surface of the container base. The springy holding down sheet member comprises at least one protruding retaining spring strip respectively pressed on the at least one hollow stud in such a manner that when a nozzle tip is inserted into the hollow stud, the respective protruding retaining spring strip is lifted, thereby opening the hollow stud for filling of an inertia gas by the nozzle tip into the inside spaced of the container; when the inserted nozzle tip is removed from the hollow stud, the respective protruding retaining spring strip immediately presses on the hollow stud to close the passage of the hollow stud.

According to still another aspect of the present invention, silver power is directly added to plastics to form a silver-contained plastic material for injection molding into parts of the designed semiconductor container such that silver power in the container absorbs sulfide, preventing crystallization on storage wafers/masks.

DETAILED DESCRIPTION OF THE PREFERRED EMBODIMENT

Figure 1:
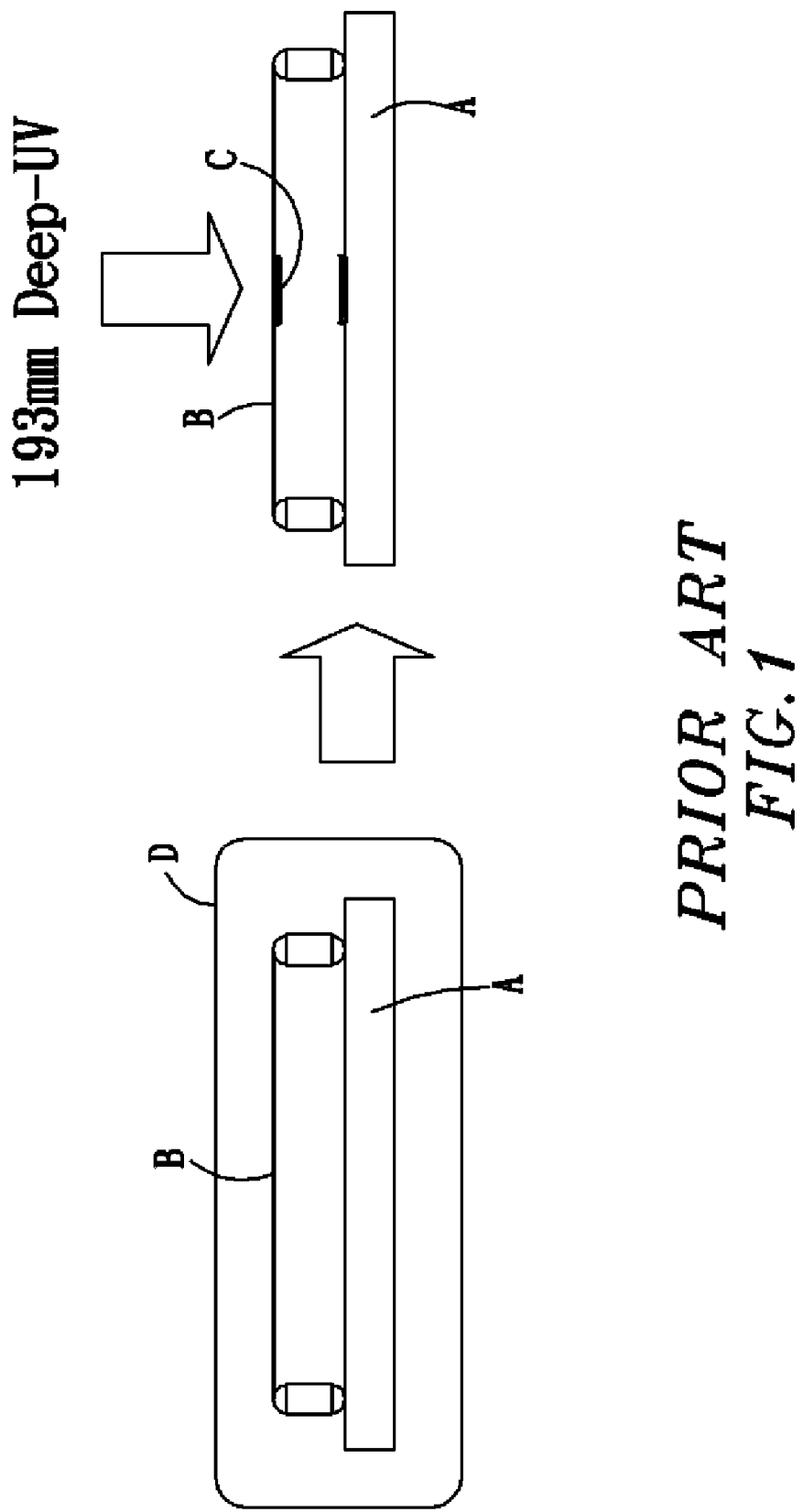
FIG. 1 is a schematic drawing showing a 193 nm deep-ultraviolet exposure bake process according to the prior art (I).
Figure 2:
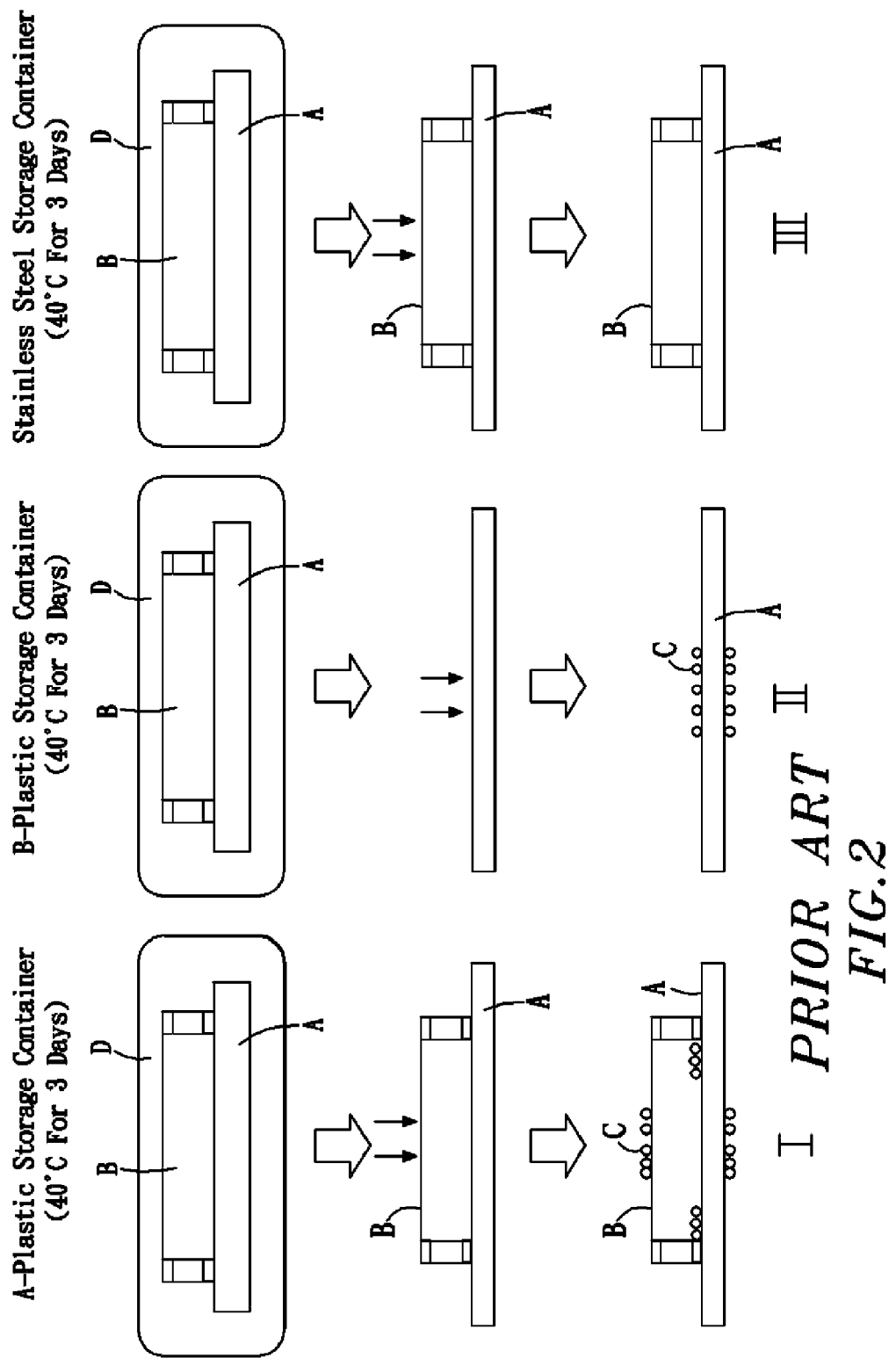
FIG. 2 is a schematic drawing showing a 193 nm deep-ultraviolet exposure bake process according to the prior art (II).
Figure 3:
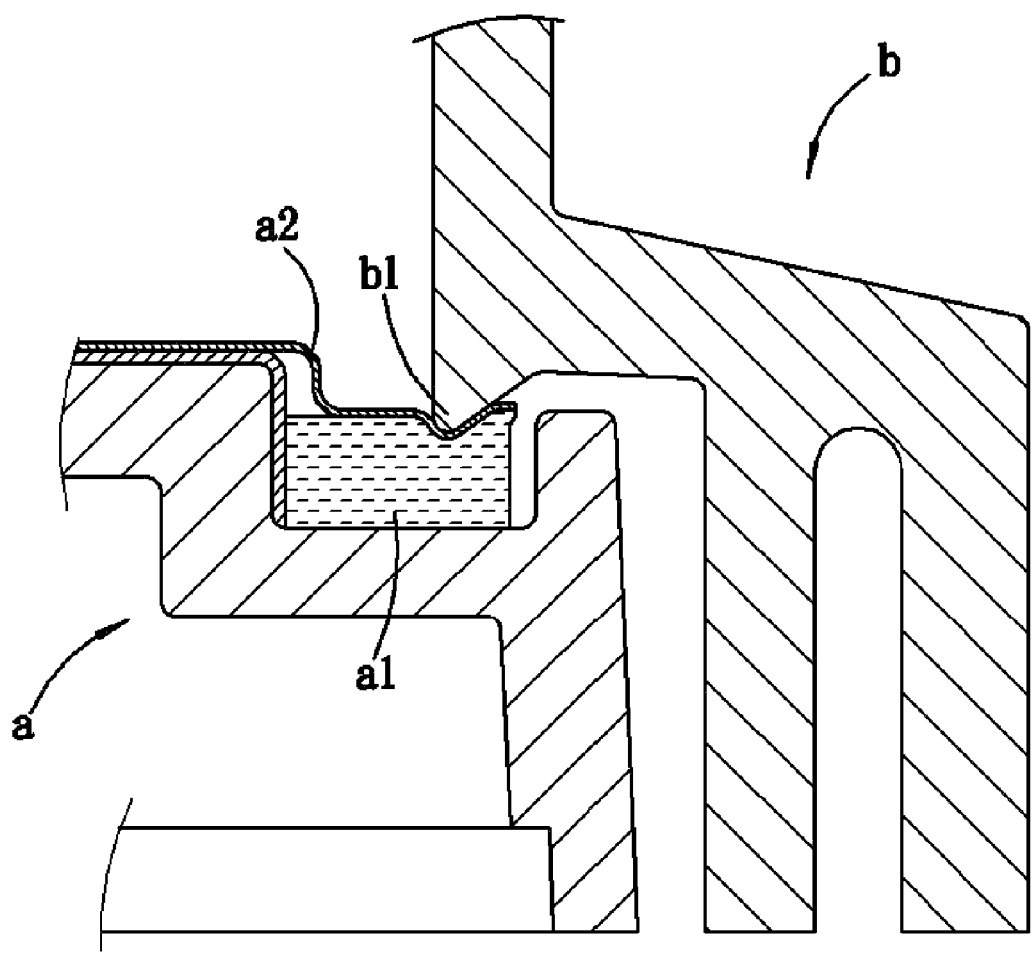
FIG. 3 is a sectional view of a part of a semiconductor transferring container according to the prior art (I).
Figure 4:
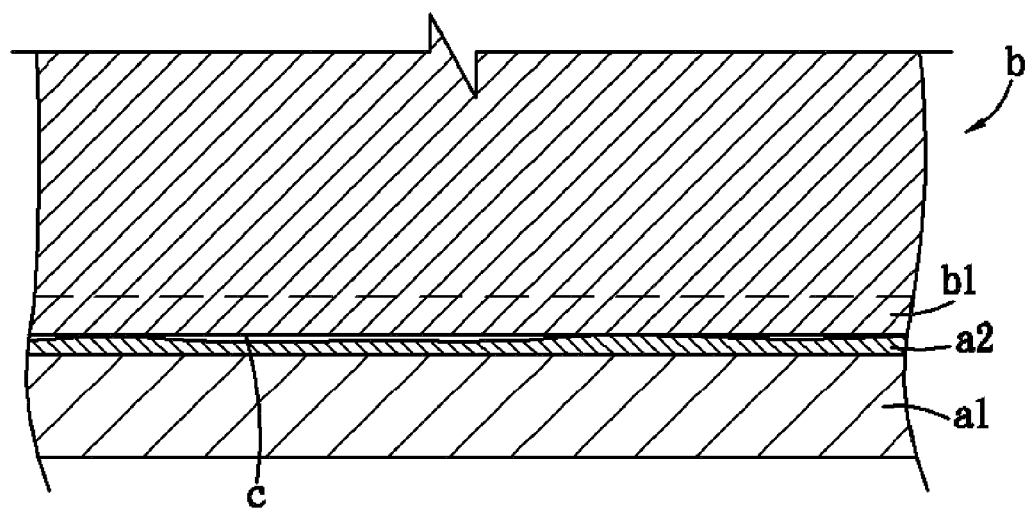
FIG. 4 is a sectional view of a part of the semiconductor transferring container according to the prior art (II).
Figure 5:
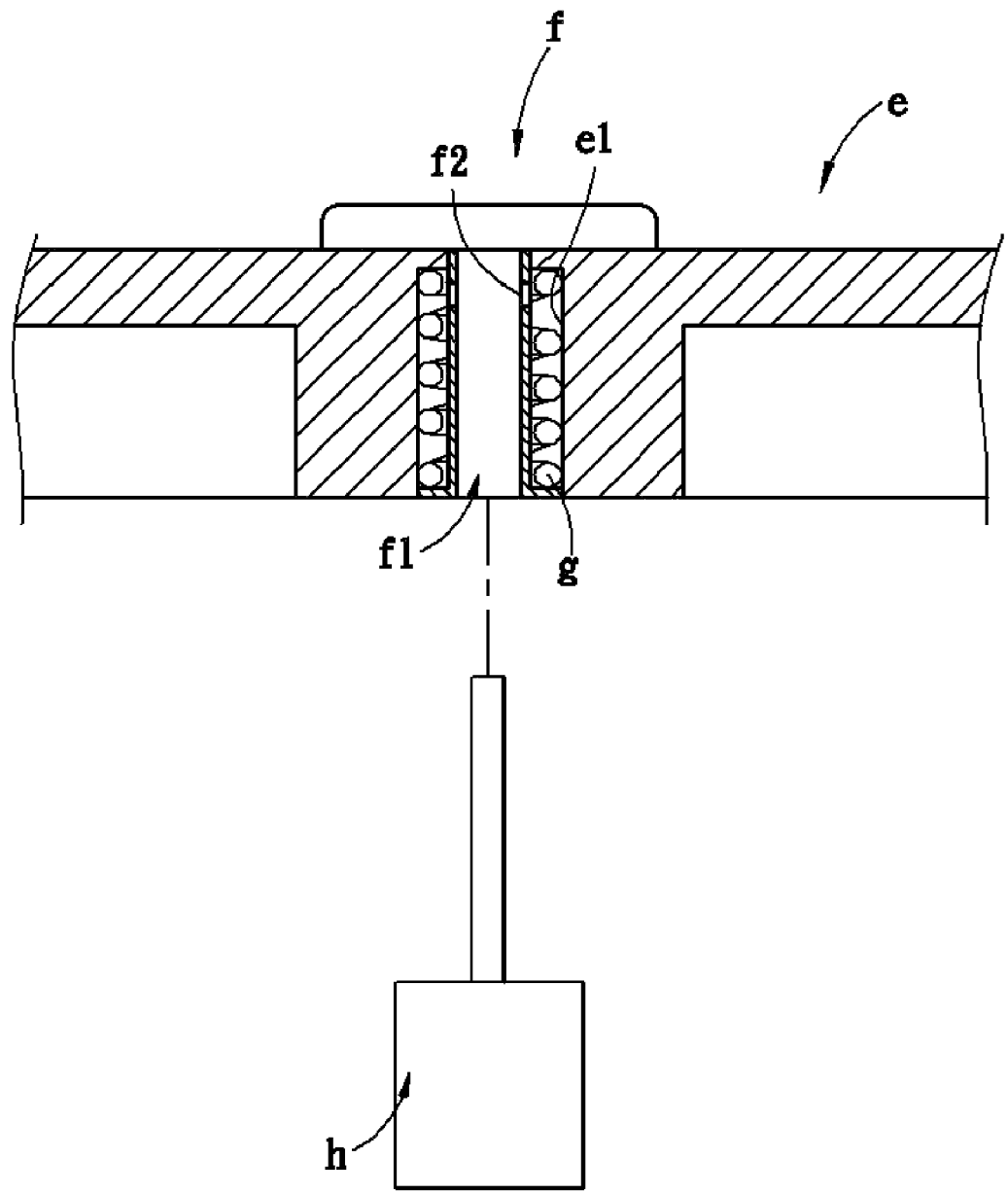
FIG. 5 is a sectional view showing the valve structure of the semiconductor transferring container according to the prior art.
Figure 6:
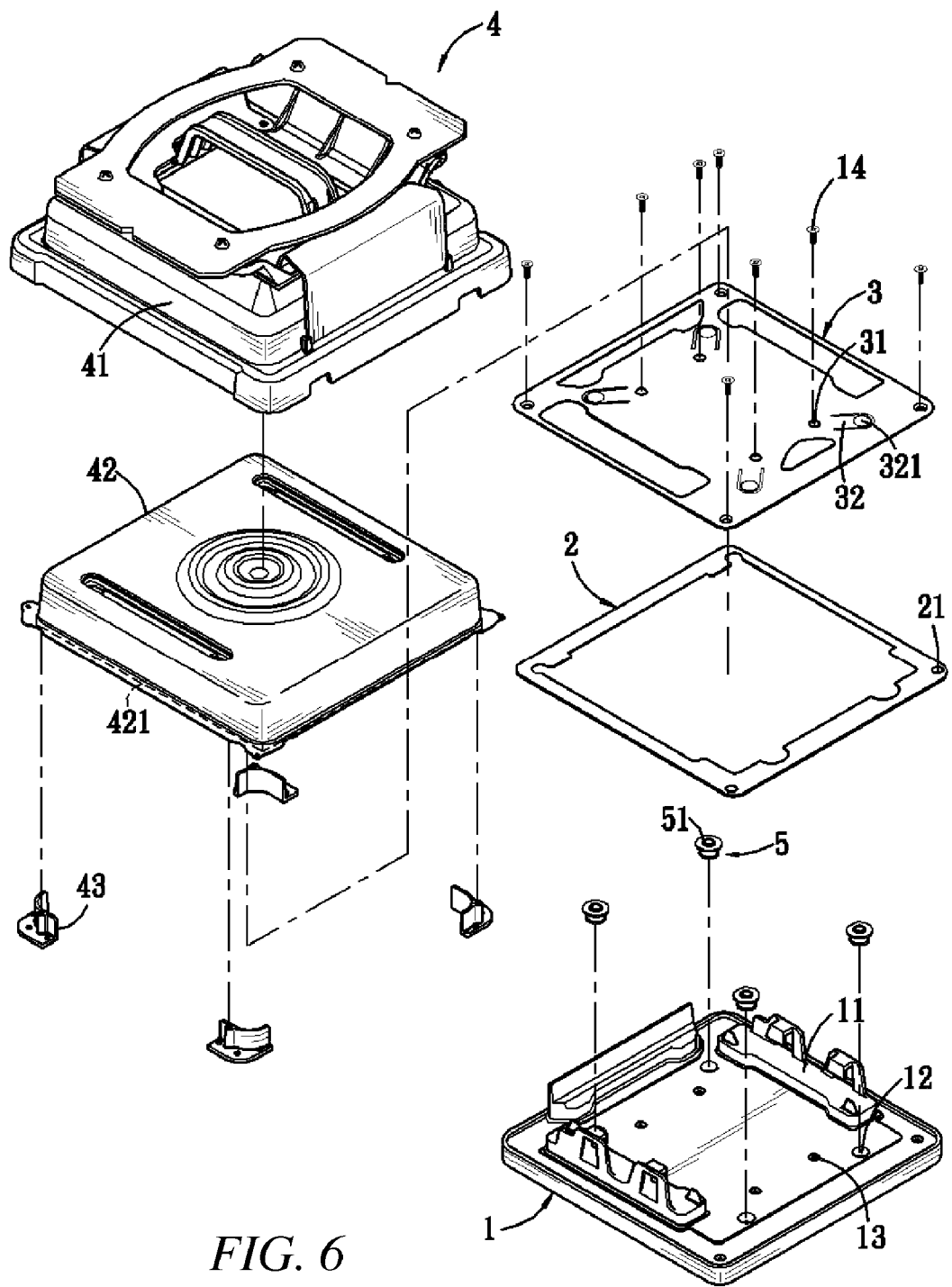
FIG. 6 is an exploded view of an airtight semiconductor transferring container according to the present invention.

Referring to FIG. 6, an airtight semiconductor transferring container in accordance with the present invention is shown comprising a container base 1, a packing member 2, a holding down sheet member 3, a top cover 4, and hollow studs 5.

The container base 1 comprises a plurality holder blocks 11 adapted to hold wafers/masks inside the airtight semiconductor transferring container, a plurality of stud holes (air filling holes) 12, and a plurality of mounting screw holes 13.

The packing member 2 is made from elastic material, having a plurality of through holes 21 corresponding to the mounting screw holes 13 of the container base 1.

The holding down sheet member 3 comprises a plurality of mounting through holes 31 corresponding to the through holes 21 of the packing member 2 and the mounting screw holes 13 of the container base 1, and a plurality of protruding retaining spring strips 32 corresponding to the stud holes (air filling holes) 12 of the container base 1. The protruding retaining spring strips 32 are respectively formed of a part of the holding down sheet member 3 by cutting.

The top cover 4 comprises an outer cover body 41, an inner lining shell 42, and a plurality of fittings 43. The inner lining shell 42 is made from elastic material and fitted into the inside of the outer cover body 41, having a downwardly protruding peripheral flange 421. The fittings 43 are respectively attached to the inner lining shell 42 and fastened to the outer cover body 41 to affix the downwardly protruding peripheral flange 421 of the inner lining shell 42 to the outer cover body 41.

The hollow studs 5 are flexible hollow members for fastening to the stud holes (air filling holes) 12, each having an annular top flange 51.

Figure 7:
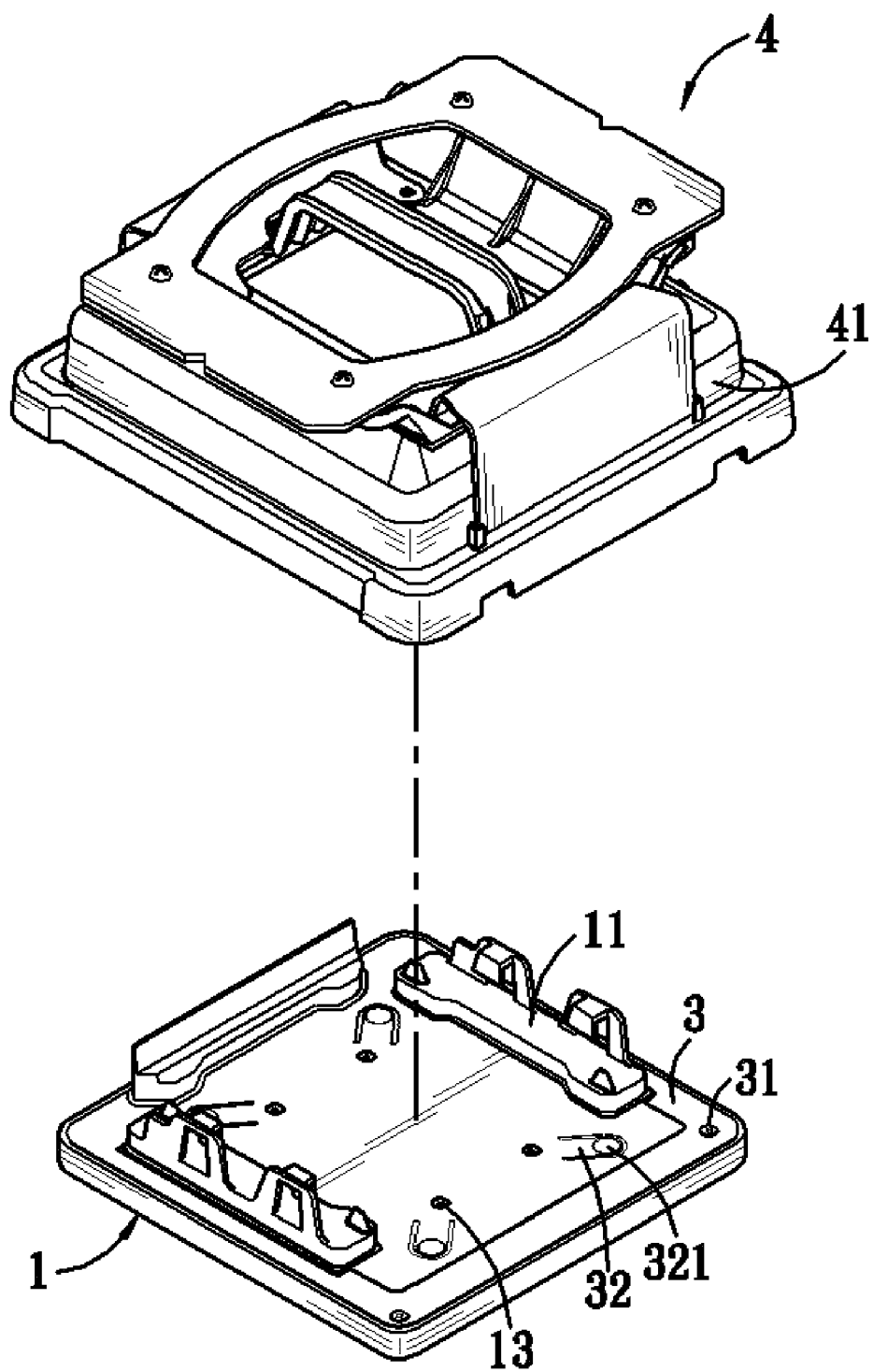
FIG. 7 is another exploded view of the airtight semiconductor transferring container according to the present invention.
Figure 8:
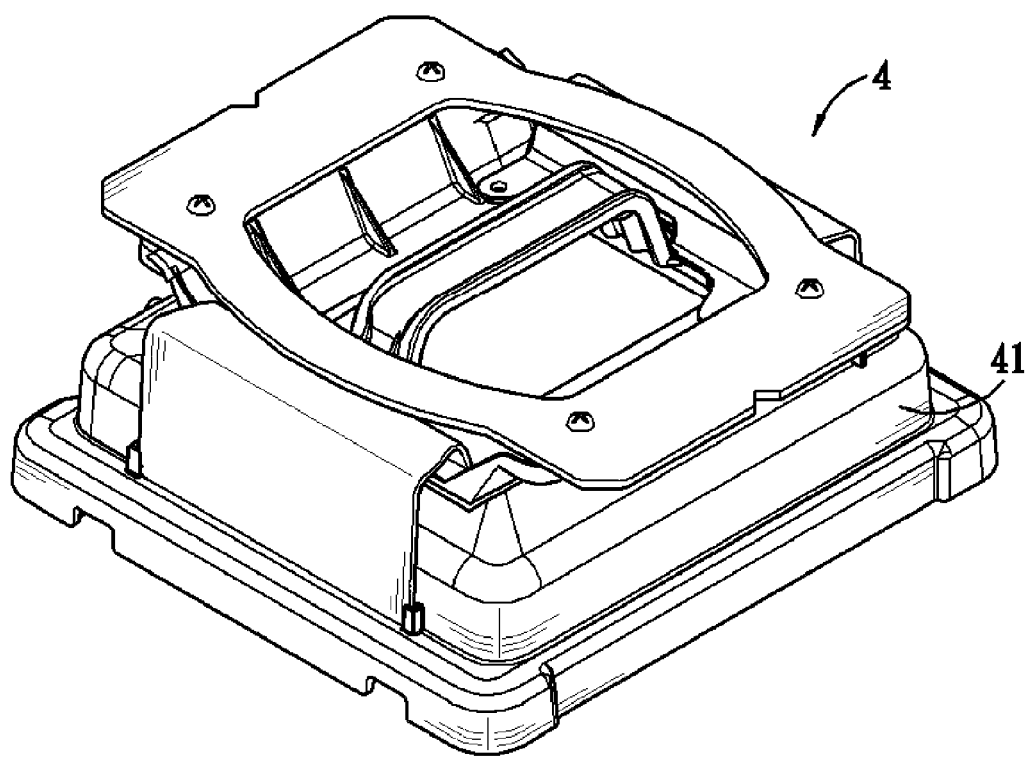
FIG. 8 is an elevational assembly view of the airtight semiconductor transferring container according to the present invention.
Figure 9:
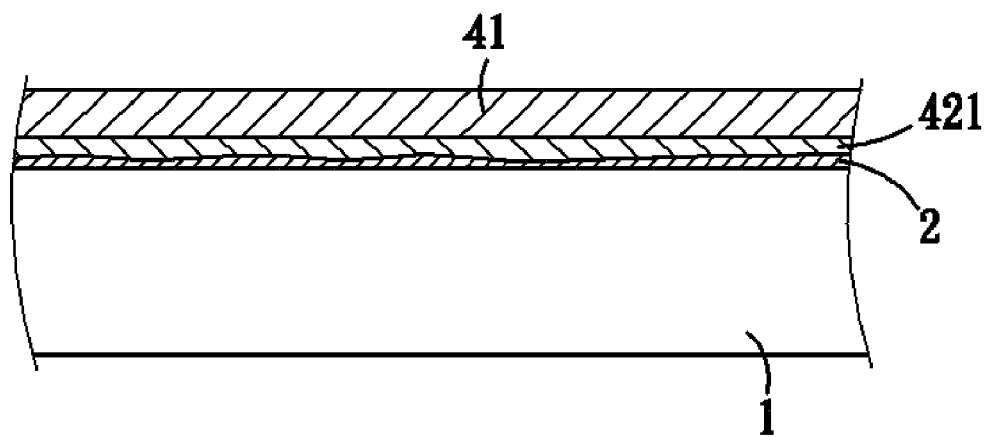
FIG. 9 is a sectional view in an enlarged scale of a part of the airtight semiconductor transferring container according to the present invention.

Referring to FIGS. 7~9 and FIG. 6 again, during assembly process, the hollow studs 5 are respectively fastened to the stud holes (air filling holes) 12 of the container base 1, and then fastening members, for example, screws 14 are respectively inserted through the mounting through holes 31 of the holding down sheet member 3 and the packing member 2 and threaded into the mounting screw holes 13 of the container base 1 to affix the holding down sheet member 3 to the container base 1, keeping the packing member 2 sandwiched in between the container base 1 and the holding down sheet member 3 and the protruding retaining spring strips 32 of the holding down sheet member 3 respectively pressed on the annular top flanges 51 of the hollow studs 5 and the holder blocks 11 protruding over the holding down sheet member 3 (the holding down sheet member 3 has openings for the passing of the holder blocks 11 of the container base 1), and then the top cover 4 is closed on the container base 1, keeping the downwardly protruding peripheral flange 421 pressed on the border area of the packing member 2. When assembled, the space defined between the inner lining shell 42 and the container base 1 is kept well in an airtight status.

The aforesaid packing member 2 and hollow studs 5 can be made from sponge, elastomeric polymers, or rubber. The holding down sheet member 3 is preferably made of resilient stainless steel, aluminum alloy, silver alloy, or plastic polymers. The inner lining shell 42 can be made from electrostatic dissipative compounds, conducting materials, or vacuum plastic absorbing materials.

Figure 10:
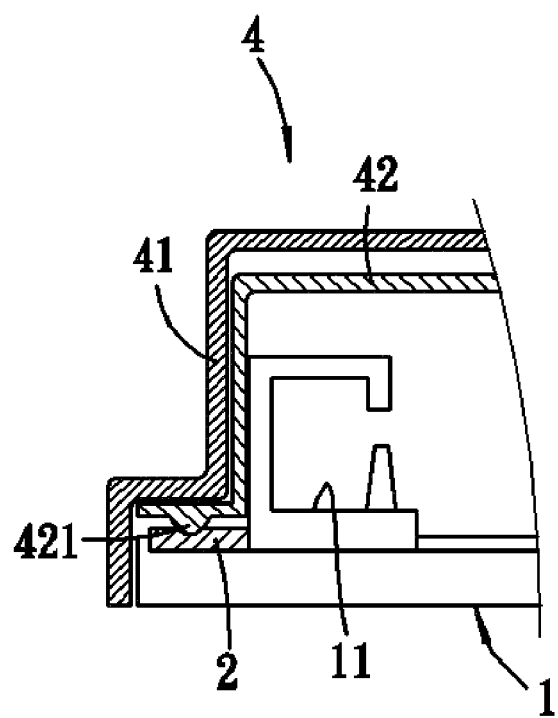
FIG. 10 is a sectional view in an enlarged scale of another part of the airtight semiconductor transferring container according to the present invention.

Referring to FIGS. 9 and 10, after closing of the outer cover body 41 of the top cover 4 on the container base 1, the downwardly protruding peripheral flange 421 of the inner lining shell 42 is kept pressed on the border area of the packing member 2, keeping the space defined between the inner lining shell 42 and the container base 1 well in an airtight status. Because the packing member 2 and the inner lining shell 42 are elastically deformable, different components of force are applied to the downwardly protruding peripheral flange 421 of the inner lining shell 42 and the packing member 2 at different locations upon closing of the outer cover body 41 of the top cover 4 on the container base 1, keeping the downwardly protruding peripheral flange 421 and the packing member 2 closely attached to each other in an airtight manner, and therefore the space defined between the inner lining shell 42 and the container base 1 is kept well in an airtight status.

Figure 11:
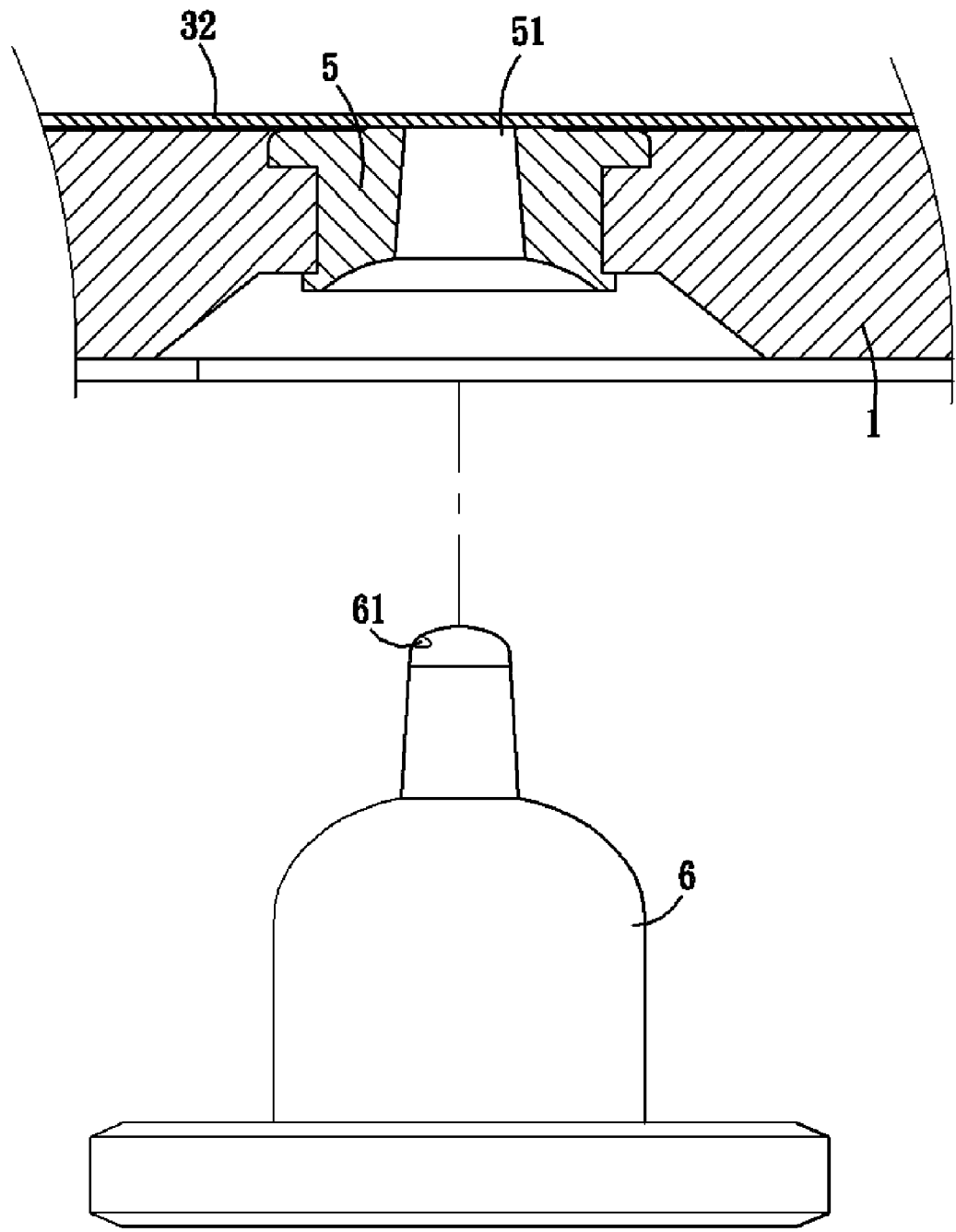
FIG. 11 is a schematic drawing showing an inertia gas filling action according to the present invention (before insertion of the nozzle tip into the hollow stud).
Figure 12:
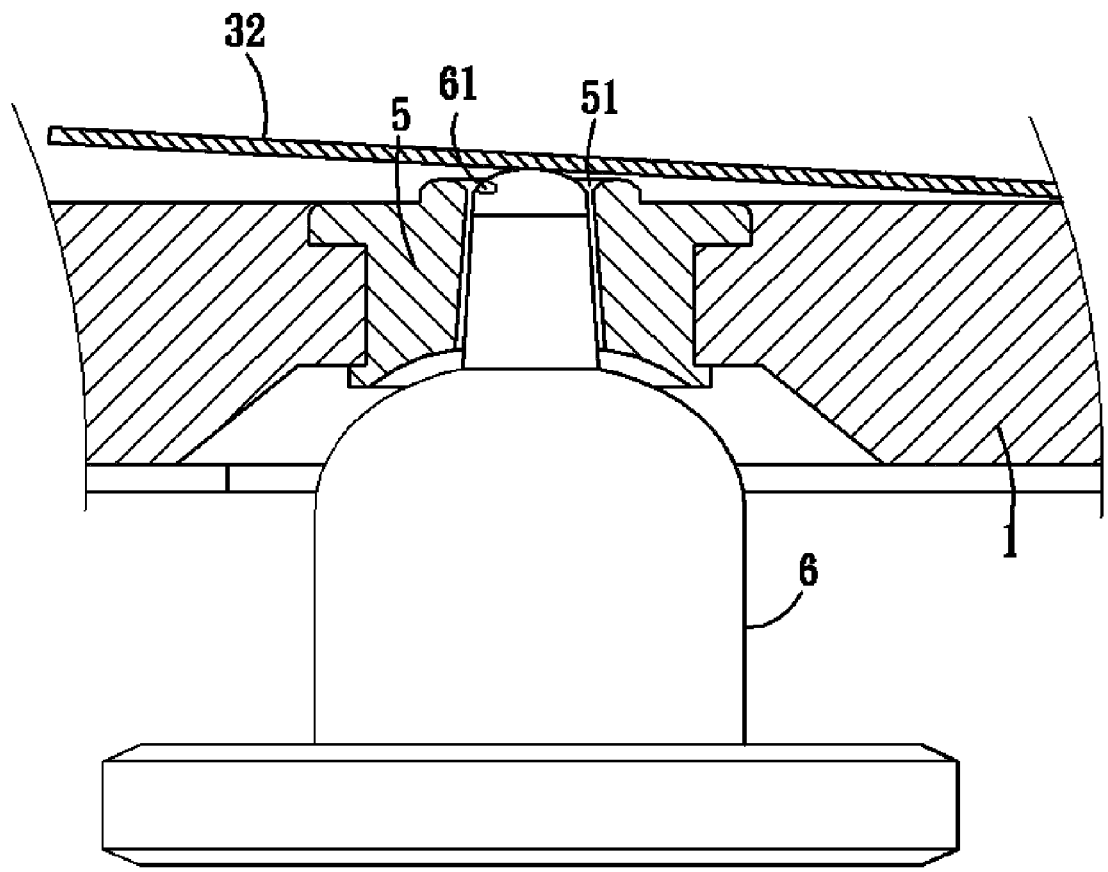
FIG. 12 is a schematic drawing showing an inertia gas filling action according to the present invention (after insertion of the nozzle tip into the hollow stud).

After storage items (wafers or masks) have been stored in the airtight semiconductor transferring container inside the space defined between the inner lining shell 42 and the container base 1, an inertia gas is filled into the airtight semiconductor transferring container. During inertia gas filling process, as shown in FIGS. 11 and 12, a gas outlet 61 of a nozzle tip 6 of a gas source (no shown) is inserted into one hollow stud 5 to lift the respective protruding retaining spring strip 32 from the annular top flange 51 of the respective hollow stud 5, allowing an inertia gas to be forced out of the gas outlet 61 of the nozzle tip 6 into the inside space of the airtight semiconductor transferring container. After filling of the inertia gas into the airtight semiconductor transferring container, the nozzle tip 6 is removed from the respective hollow stud 5. Immediately after removal of the nozzle tip 6 from the respective hollow stud 5, the respective protruding retaining spring strip 32 immediately returns to its former shape to press on the annular top flange 51, thereby closing the respective hollow stud 5. The arrangement of the hollow studs 5 and the protruding retaining spring strips 32 enables the user to fill an inertia gas into the airtight semiconductor transferring container conveniently. This arrangement is simple and cost-effective.

Figure 13:
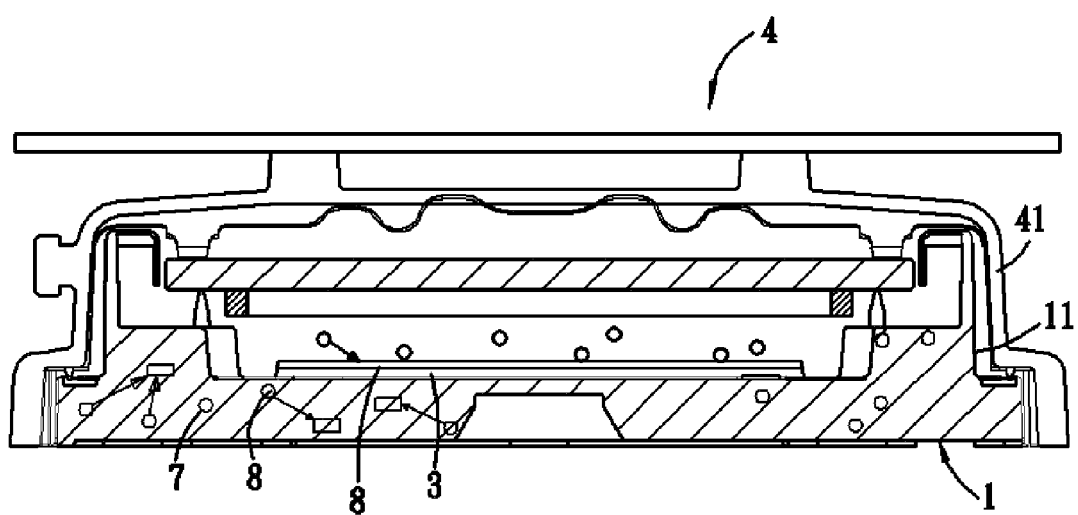
FIG. 13 is a schematic sectional view of the present invention, showing absorption of sulfide inside the airtight semiconductor transferring container.

Referring to FIG. 13, the container base 1 and the top cover 4 are respectively injection-molded from an electrostatic dissipative compound. If the container base 1 and the top cover 4 are directly injection-molded from a pure polymeric compound that is derived from petroleum and contains a certain amount of sulfide 7, sulfide 7 will change into vapor, thereby causing formation of crystals on the surface of the storage items (wafers/masks). In order to eliminate this problem, powdered silver 8 is added to the electrostatic dissipative compound to absorb sulfide 7, preventing formation of crystals on storage items (wafers/masks). Further, container base 1 or the holding down sheet member 3 may be coated with a layer of silver 8 to absorb sulfide 7 from the air inside the airtight semiconductor transferring container.

As indicated above, the airtight semiconductor transferring container has the following features.

1. The invention has the elastic packing member and the elastic inner lining shell respectively mounted on the top surface of the container base and fitted into the inside of the outer container body so that when the user closes the top cover on the container base, the downwardly protruding peripheral flange is pressed on the packing member, keeping the inside space of the airtight semiconductor transferring container well in an airtight status. Further, because the packing member and the inner lining shell are elastically deformable, different components of force are applied to the downwardly protruding peripheral flange of the inner lining shell and the packing member at different locations upon closing of the outer cover body of the top cover on the container base, keeping the downwardly protruding peripheral flange of the inner lining shell and the packing member closely attached to each other in an airtight manner, and therefore the inside space of the airtight semiconductor transferring container is kept well in an airtight status.

2. The invention has silver powder added to the electrostatic dissipative compound for injection-molding the desired container base and top cover to absorb sulfide, providing a safety storage environment and preventing formation of crystals on the surface of the storage items (wafers/masks).

3. The holding down sheet member has protruding retaining spring strips for pressing on the annular top flange of each of the hollow studs to close the passage of each of the hollow stud. When the user inserts a nozzle tip into one hollow stud, the respective hollow stud is opened for enabling the nozzle tip to fill an inertia gas into the inside space of the airtight semiconductor transferring container. The respective protruding retaining spring strip automatically closes the respective hollow stud immediately after removal of the inserted nozzle tip.

A prototype of airtight semiconductor transferring container has been constructed with the features of FIGS. 7~14. The airtight semiconductor transferring container functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An airtight semiconductor transferring container comprising a container base, said container base having at least one stud hole extending through top and bottom surfaces thereof, an elastically deformable packing member covered on the top surface of said container base, a top cover closed on said container base and defining with said container base an airtight chamber, and at least one hollow stud respectively mounted in said stud holes of said container base for the insertion of a nozzle tip to fill an inertia gas into said airtight chamber, wherein said container base is fixedly mounted with a springy holding down sheet member to hold down said elastically deformable packing member on the top surface of said container base, said springy holding down sheet member comprising at least one protruding retaining spring strip respectively pressed on said at least one hollow stud in such a manner that when a nozzle tip is inserted into one said hollow stud, the respective protruding retaining spring strip is lifted, thereby opening the respective hollow stud for filling of an inertia gas by said nozzle tip into said airtight chamber; when the inserted nozzle tip is removed from the respective hollow stud, the respective protruding retaining spring strip immediately presses on the respective hollow stud to close the passage of the respective hollow stud.

2. The airtight semiconductor transferring container as claimed in claim 1, wherein said container base has a plurality of mounting screw holes; said springy holding down sheet member has a plurality of mounting through holes respectively fastened to the mounting screw holes of said container base by a respective fastening member, keeping said elastically deformable packing member sandwiched in between the top surface of said container base and said springy holding down sheet member.

3. The airtight semiconductor transferring container as claimed in claim 1, wherein said container base comprises a plurality of holder blocks upwardly protruding over said holding down sheet member for holding semiconductor components.

4. The airtight semiconductor transferring container as claimed in claim 1, wherein said holding down sheet member is made of steel.

5. The airtight semiconductor transferring container as claimed in claim 1, wherein said holding down sheet member is made of silver alloy.

6. The airtight semiconductor transferring container as claimed in claim 1, wherein said holding down sheet member is molded from plastics.

7. The airtight semiconductor transferring container as claimed in claim 1, wherein said holding down sheet member is made of aluminum alloy.

* * * * *